(12) United States Patent
Brucchi

(10) Patent No.: US 10,201,087 B2
(45) Date of Patent: Feb. 5, 2019

(54) DISCRETE DEVICE

(71) Applicant: Infineon Technologies Austria AG, Villach (AT)

(72) Inventor: Fabio Brucchi, Rome (IT)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 15/474,716

(22) Filed: Mar. 30, 2017

(65) Prior Publication Data

US 2018/0288878 A1    Oct. 4, 2018

(51) Int. Cl.
*H01L 23/04*        (2006.01)
*H05K 1/18*         (2006.01)
*H05K 1/11*         (2006.01)
*H01L 23/488*       (2006.01)
*H01R 12/58*        (2011.01)

(52) U.S. Cl.
CPC ............ *H05K 1/184* (2013.01); *H01L 23/04* (2013.01); *H01L 23/488* (2013.01); *H01R 12/585* (2013.01); *H05K 1/115* (2013.01); *H05K 2201/1081* (2013.01); *H05K 2201/10166* (2013.01); *H05K 2201/10787* (2013.01); *H05K 2201/10795* (2013.01)

(58) Field of Classification Search
USPC ........................................................ 361/773
See application file for complete search history.

(56) References Cited

U.S. PATENT DOCUMENTS

| | | | |
|---|---|---|---|
| 6,280,219 B1* | 8/2001 | Sano | H01R 13/193 439/268 |
| 2007/0170578 A1* | 7/2007 | Yoshikawa | H01L 21/4846 257/700 |
| 2010/0140721 A1* | 6/2010 | Takagi | H01L 23/66 257/401 |

FOREIGN PATENT DOCUMENTS

WO    2016/178861    11/2016

OTHER PUBLICATIONS

EP Office Action dated Aug. 8, 2018 in parallel EP Application No. 18164462.6.

* cited by examiner

*Primary Examiner* — Andargie M Aychillhum
(74) *Attorney, Agent, or Firm* — Dicke, Billig & Czaja, PLLC

(57) ABSTRACT

A device includes a circuit element, a housing for the circuit element and a terminal for coupling the circuit element to an electrical circuit. The terminal includes an engagement portion and a sleeve portion. The engagement portion is configured to engage a base for the electrical circuit. The sleeve portion couples the engagement portion to the circuit element. The housing encloses the sleeve portion.

20 Claims, 8 Drawing Sheets

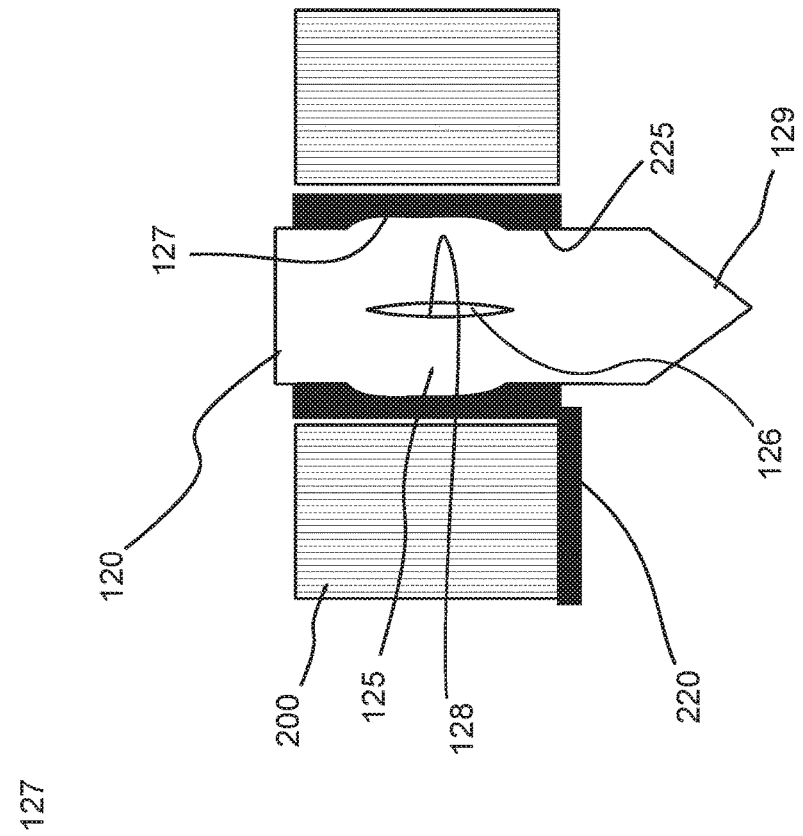
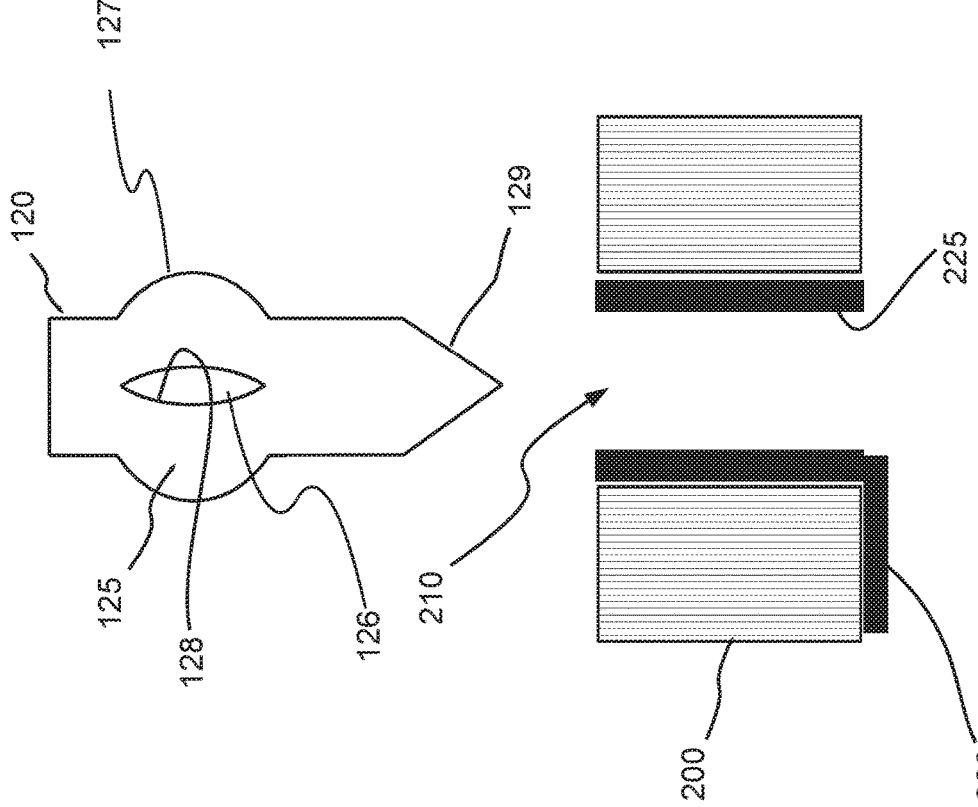
FIG 5B
FIG 5A

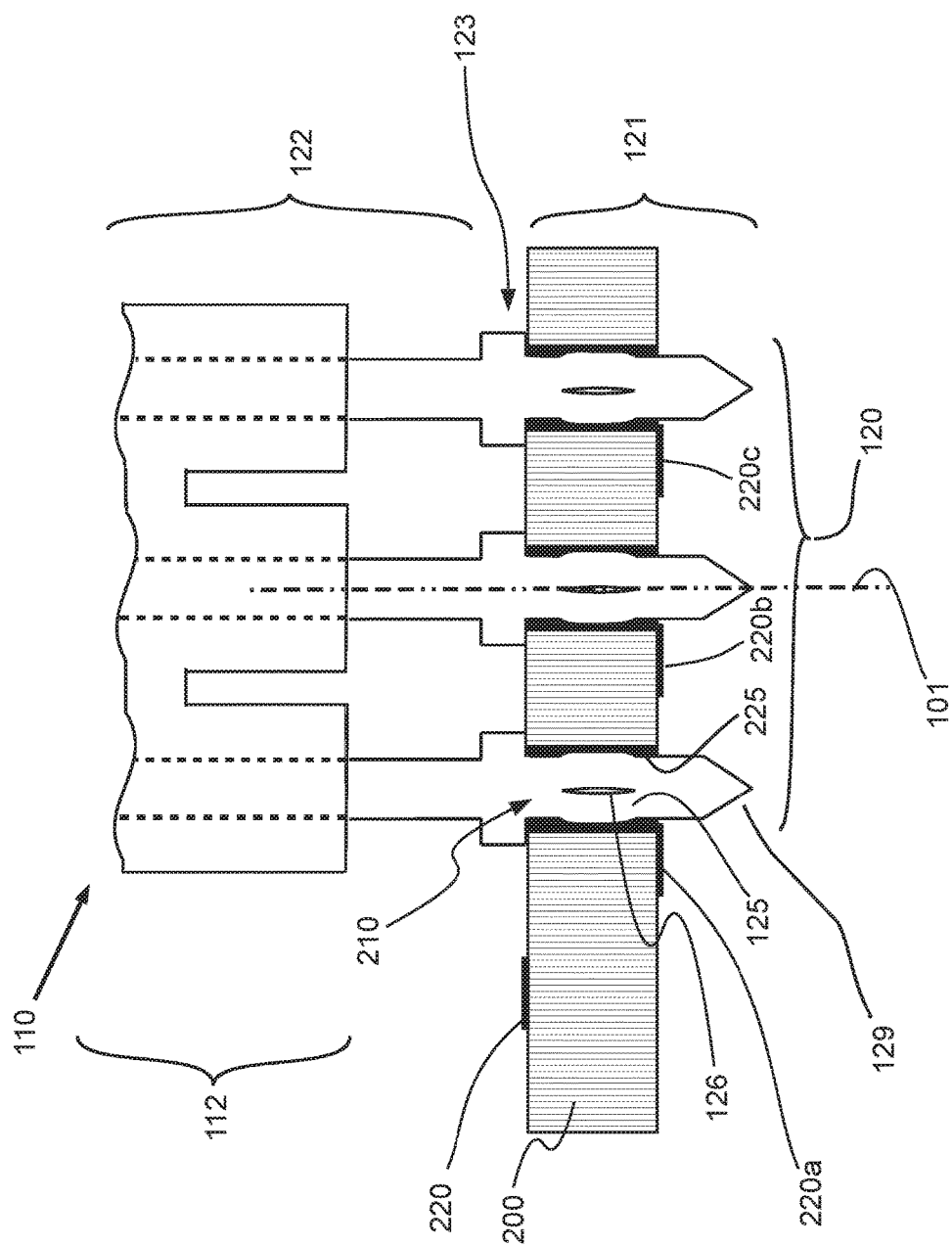

DISCRETE DEVICE

BACKGROUND

Electrical connector elements are extensively used in various manners to connect a discrete device to a printed circuit board (PCB) or to conductor tracks disposed thereon. For example, a package is used to package a power transistor die. The package includes three parallel extending metal connector pins. On a printed circuit board, the package's connector pins are electrically connected to conductor tracks provided on the printed circuit board. These connector pins generally engage in openings or holes already present in the printed circuit board.

The connector pins can be provided as solder pins, because they are soldered to the printed circuit board. Electrical and opto-electrical modules are connected to the printed circuit board with these connector or solder pins.

The soldering of the connector pins to the printed circuit board presents a number of disadvantages. Usually, the soldering process is inconvenient and tedious, requiring high manual effort, expensive machines and high energy utilization. The conventional soldering process requires heat which may be detrimental to heat sensitive elements within the module connected to the printed circuit board. This increases the cost as high temperature materials which can withstand the heat are required. Furthermore, a printed circuit board may support many such electrical or opto-electrical modules. In case a single such module fails, due to soldered connector pins, the entire printed circuit board has to be removed for service. Additionally, the solder pins provide low tolerance to any tilting force that is applied to the connected electrical or opto-electrical modules, thereby, resulting in a fragile configuration.

Connector pins can also be pinched into openings or holes. Where the openings have a conductive wall surface connected to the conductor track, an electrical contact of the connector pin to the conductive wall surface can establish an electrical connection of the connector pin to the conductor track. However, forcing the connector pins into the respective holes comes with plenty of loss in large scale mass fabrication, since a tool has to apply a great force to ensure good contact, while, at the same time, mass manufacturing requires the process to be performed at great speed. It is therefore difficult to precisely align a connector pin with the hole that is to receive the pin. Therefore, when sinking the connector pins into corresponding holes, the pins can bend and/or refuse to enter the holes. However, if the holes are made wider so as to require less force in order to stick the connector pins into the holes, the electrical contact can be become unreliable. Also, the connector pins may not provide sufficient mechanical stability for the discrete device on the board.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Described herein are techniques that can be useful, for example, in electrical circuits that include a discrete element. Embodiments disclosed herein encompass a discrete device.

In an aspect of the invention, an apparatus comprises a base and a discrete device. The base supports an electrical circuit. The base has a via that extends through the base. The discrete device has a housing and a terminal that extends from the housing. The terminal penetrates the via. The housing abuts the base.

In another aspect of the invention, a device comprises a circuit element, a housing for the circuit element, and a terminal for coupling the circuit element to the electrical circuit. The terminal comprises an engagement portion and a sleeve portion. The engagement portion is configured to engage a base for the electrical circuit. The sleeve portion couples the engagement portion to the circuit element contained in the housing. The housing encloses the sleeve portion. The device can be used in an electrical circuit.

In yet another aspect, the invention encompasses a device for use in an electrical circuit. The device comprises a circuit element and a housing for the circuit element. Further, the device comprises at least one terminal for coupling the circuit element to the electrical circuit. The housing comprises an element housing portion and a terminal housing portion. The circuit element is enclosed in the element housing portion, while the at least one terminal is at least partially enclosed in the terminal housing portion.

The independent claims define the invention in various aspects. The dependent claims state selected elements of embodiments according to the invention in various aspects.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognise additional features and advantages upon reading the following detailed description, and upon viewing the accompanying drawings.

BRIEF DESCRIPTION OF THE DRAWINGS

Embodiments according to the claimed subject matter are described below with reference to the drawings. The detailed description references the accompanying figures. The same numbers can be used throughout the drawings to reference like features and components. As used herein, like terms refer to like elements throughout the description. It should be noted that views of exemplary embodiments are merely to illustrate selected features of the embodiment. The views qualitatively illustrate exemplary features of some embodiments and, therefore, should not be interpreted as being drawn to scale.

FIG. 5A and FIG. 5B show partial cross-sectional side views of a base and a discrete device before and after engaging with each other, according to some embodiments.

FIG. 6 shows a partial cross-sectional side view of a discrete device engaged with a base, in accordance with some embodiments.

DETAILED DESCRIPTION OF EMBODIMENTS

For purposes of explanation, numerous specific details are set forth in order to provide a thorough understanding of the claimed subject matter. It may be evident, however, that the claimed subject matter may be practised without these specific details. Also, in some instances, well-known features are omitted or simplified to clarify the description of the exemplary implementations.

Reference will now be made to the drawings to describe the present invention in detail. The implementations herein are described in terms of exemplary embodiments. However, it should be appreciated that individual aspects of the implementations may be separately claimed and one or more of the features of the various embodiments may be combined.

Generally, in the examples described below, a discrete device may be a discrete element, such as a transistor, in particular a power transistor, provided in a housing that has an improved stability against bending and/or tilt vis-à-vis a base provided to support the discrete device as part of an electrical circuit. Depending on the electrical circuit element, the discrete element can be, for example, a packed power transistor device such as an insulated-gate bipolar transistor (IGBT).

Figure 1:
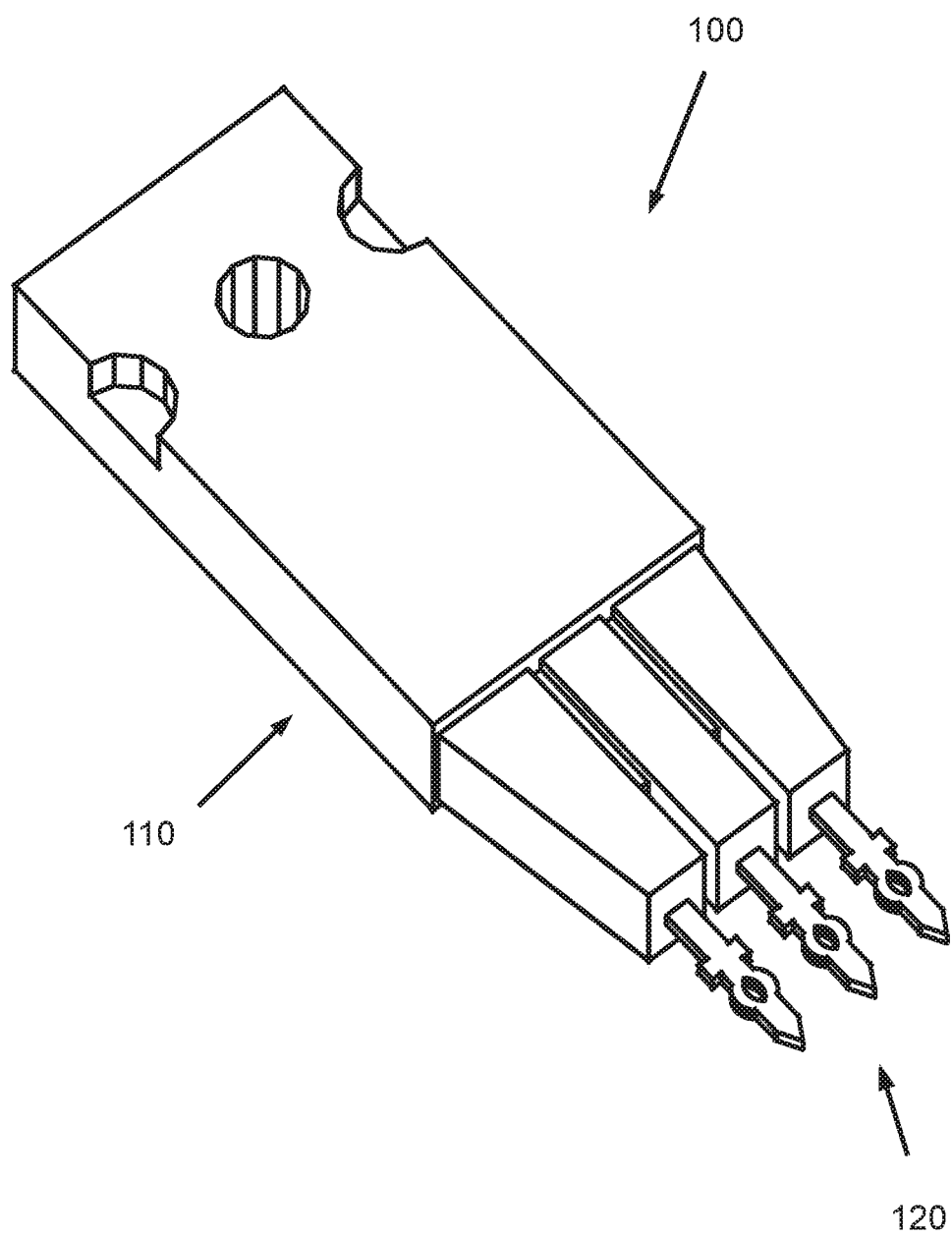
FIG. 1 shows an isometric view that illustrates a discrete device according to one embodiment of the invention.

FIG. 1 shows an isometric view of a discrete device 100 according to some embodiments. The discrete device 100 comprises a housing 110, an electrical circuit element (not shown) enclosed in the housing, and a plurality of terminals 120 extending from the housing.

Figure 2:
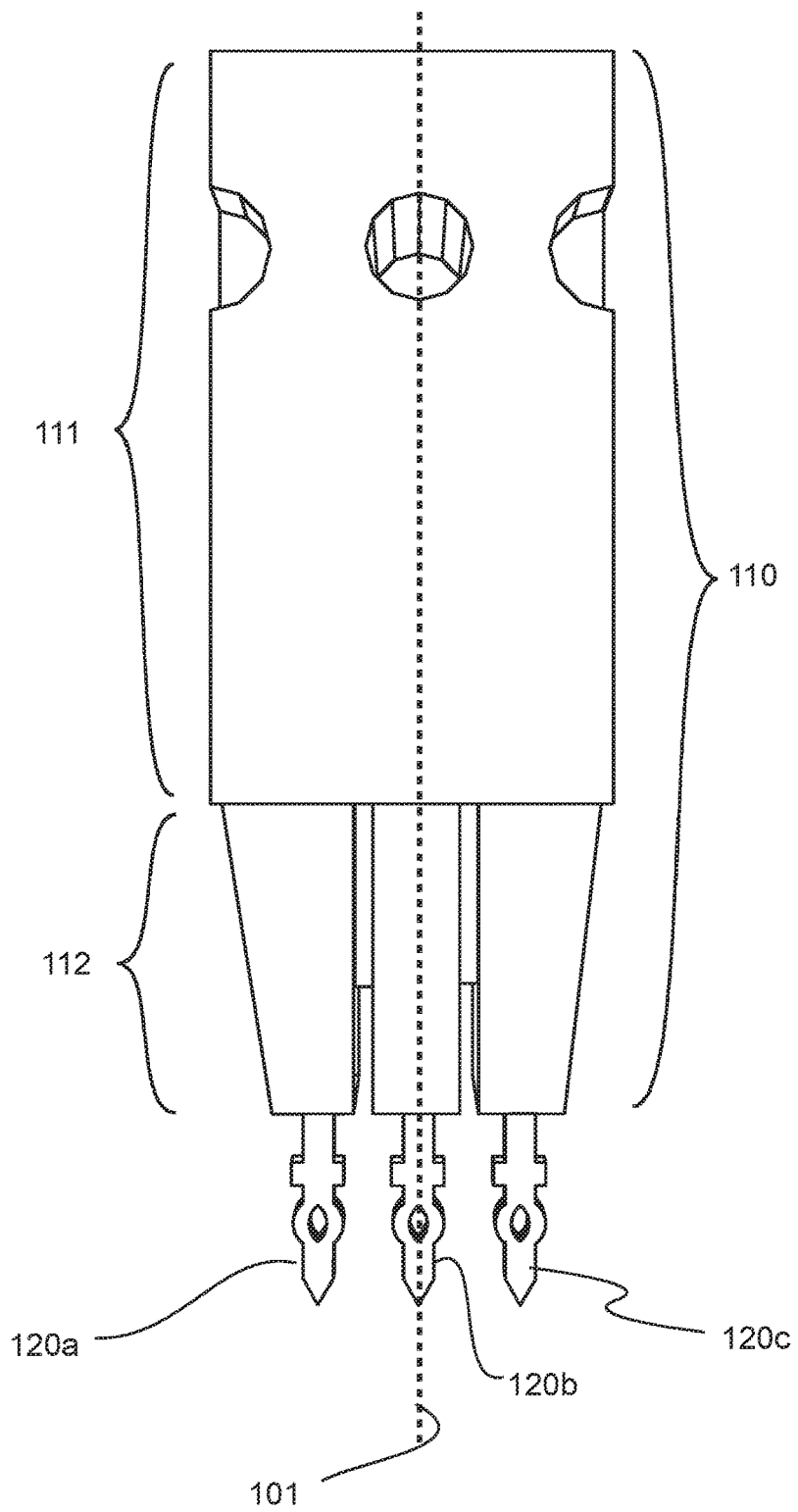
FIG. 2 shows a side view that illustrates a discrete device according to one embodiment of the invention.

FIG. 2 shows a side view of the discrete device 100 according to some embodiments. In some embodiments, the housing 110 encompasses a plurality of portions, sections or segments that can be distinguished from one another in a longitudinal axial direction (indicated in FIG. 2 by an axis 101) of the housing 110. An example is shown in FIG. 2. Accordingly, the housing 110 may comprise an element housing portion 111 at a distal end of the housing 110 and a terminal housing portion 112 at a proximal end of the housing. The housing 110 may be made of any suitable material such as glass, metal, polymer, plastic, epoxy resin, thermosetting plastic, fiber reinforced plastic, ceramic packaging material or any combination thereof. The element housing portion 111 and the terminal housing portion 112 may be made of the same material or of different materials. The element housing portion 111 and the terminal housing portion 112 may be formed as a single continuous unit. Alternatively, the element housing portion 111 and the terminal housing portion 112 may be formed separately and later joined together to form the housing 110.

The element housing portion 111 of the housing 110 may enclose the electrical circuit element (not shown in FIG. 2). The housing 110 may guard the electrical circuit element from mechanical strain or excess heat which can be damaging to the electrical circuit element. In addition, the element housing portion 111 of the housing 110 may also provide electrical or electromagnetic shielding for the electrical circuit element.

At the proximal end, the terminals 120 extend from the terminal housing portion 112 of the housing 110. Generally, the discrete device 100 can comprise at least three terminals 120. For example, the plurality of terminals 120 comprises three terminals 120a, 120b and 120c. In some embodiments, where the discrete device 100 is a transistor device, for example, a first terminal 120a can be an emitter terminal, a second terminal 120b can be a collector terminal and a third terminal 120c can be a base terminal. However, the invention is not limited to three terminals, and any number of terminals, more or less than three, can be present without deviating from the scope of the invention. For the purpose of readability, to the extent that the three terminals 120a, 120b and 120c are essentially structurally the same, irrespective of any difference in electrical function with respect to the electrical circuit element enclosed in the housing 110 that the respective terminal 120a, 120b and 120c is connected to, the terminals are referred to by the same reference numeral 120. At least outside the housing 110, the three terminals 120 may each be of a same shape and/or size. Generally, the three terminals 120 may each be arranged in a same plane. At least one effect can be that the plurality of terminals, using a cookie-cutter method, in a single cutting operation, can be cut, for example, from a sheet metal.

Figure 3:
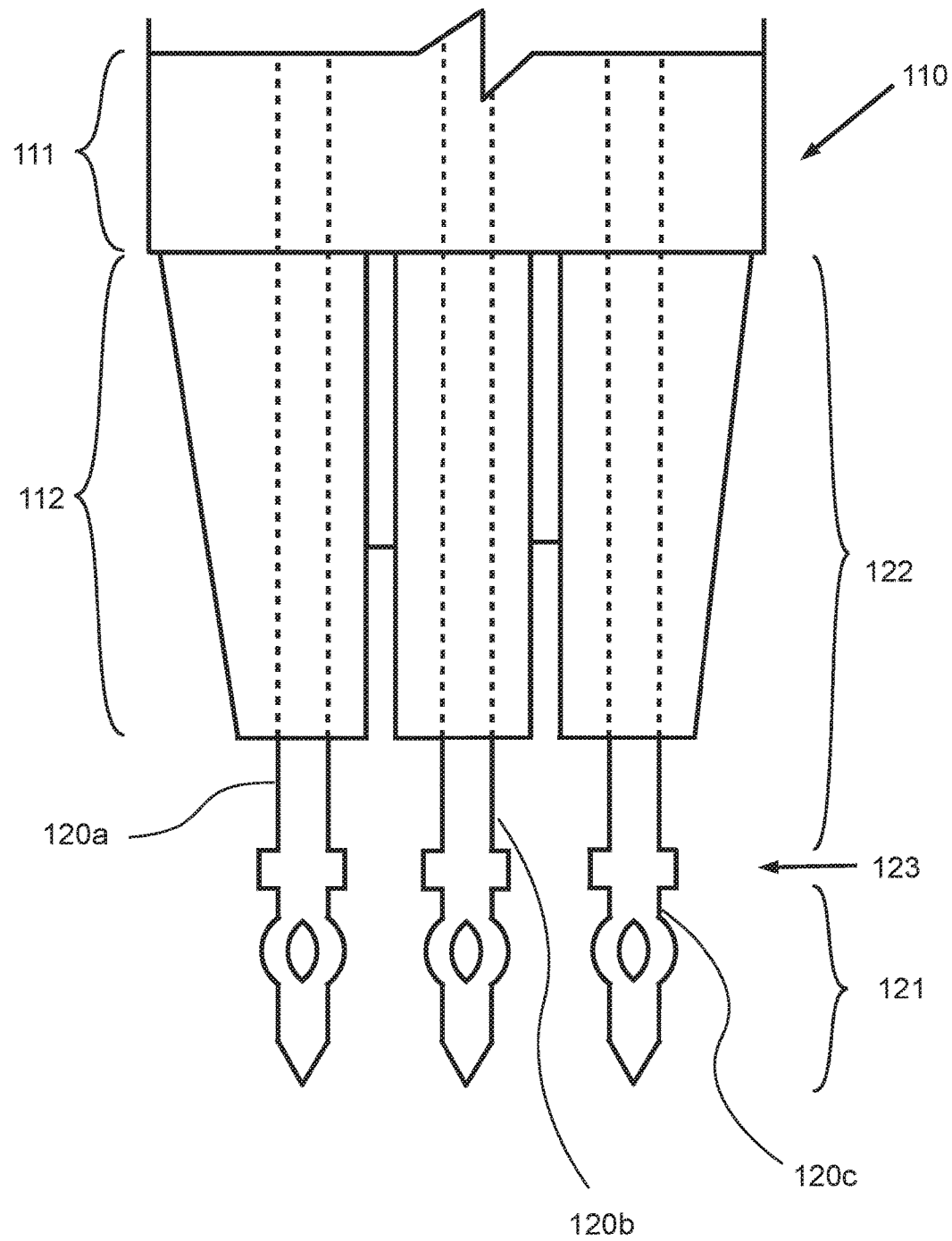
FIG. 3 shows a partial side view of a discrete device according to one embodiment of the invention.

FIG. 3 is a partial side view that illustrates the proximal end of the discrete device 100 according to some embodiments. The terminals 120, where encapsulated by the housing 110, are indicated by broken lines. The terminals 120 run from the element housing portion 111 all through the terminal housing portion 112 and extend from the terminal housing portion 112 at the proximal end of the housing 110 to the outside of the housing 110. In the illustrated embodiments, at least for a portion of the terminals 120 that are not enclosed by the element housing portion 111, the terminals 120 are structurally the same. In other embodiments (not shown) the terminals 120 can differ from one another.

The terminals 120 may comprise an engagement portion 121 and a sleeve portion 122. The engagement portion 121 of the terminals 120 is configured to engage an opening in the base. To this end, the engagement portion 121 is completely outside the housing 110. Further, the engagement portion 121 may have an elongated body.

Figure 4:
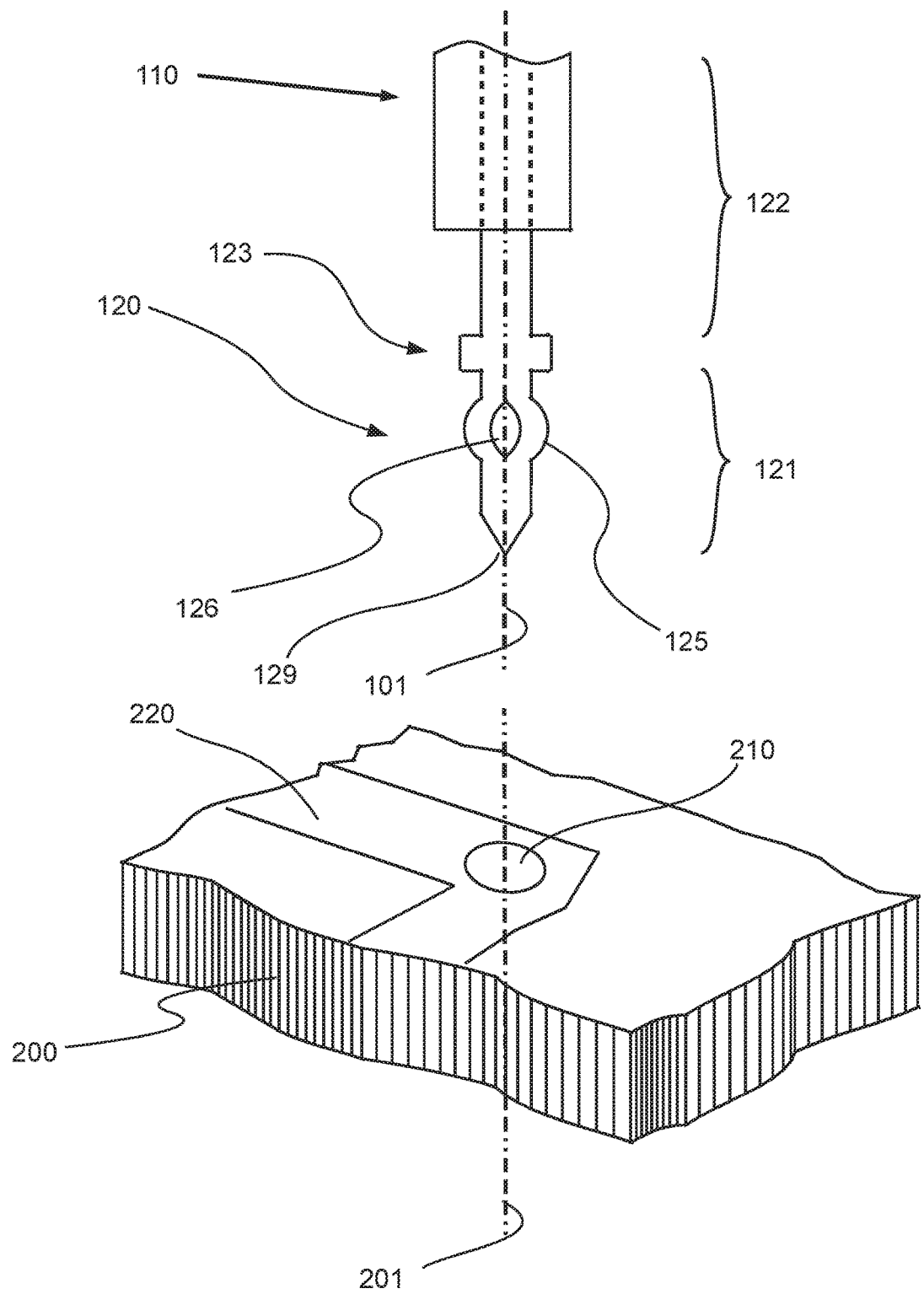
FIG. 4 shows a partial schematic view of a base and a discrete device ready to be inserted into a corresponding through-hole of the base, in accordance with one embodiment of the present invention.

FIG. 4 shows, in accordance with one embodiment of the present invention, a partial perspective view of a base 200 having a through-hole, herein also referred to as via 210. Further, FIG. 4 shows a partial side view of the discrete device 100 ready to be inserted into the via 210 of the base 200.

The base 200 can be any substrate, such as a printed circuit board (PCB), which supports an electrical circuit (not shown). The base 200 including the via 210 is configured to engage with the engagement portion 121 of the terminal 120 of the discrete device 100. The via 210 may comprise a conductive liner (not shown in FIG. 4) connected to a conductor line 220 of the electrical circuit supported by the base 200. While the conductor line 220 in FIG. 4 is shown on a top surface of the base 200 that faces the discrete device 100, other conductor lines (not shown in FIG. 4) can also be provided, opposite to the top surface, on a bottom surface of the base. The conductive liner may provide for an electrically conductive contact between the engagement portion 121 of the terminal 120 and the electrical circuit.

Generally, the engagement portion 121 of the terminal 120 is configured to engage the base 200. To this end, in some embodiments, the engagement portion 121 of the terminal 120 may comprise a tip 129. The tip 129 of the engagement portion 121 may be tapered. The tapering of the tip 129 allows for the engagement of the engagement portion 121 with the via 210 of the base 200 to be accomplished with more tolerance. At least one effect can be that, even if there is a slight misalignment of the axis 101 of the terminal 120 and an axis 201 of the hole, when about to be sunk into the hole, the tip 129 can guide the terminal 120 into the hole. Thus, any requirement of a co-axial alignment of an axis 201 of the via 210 and an axis 101 of the engagement portion 121 is less stringent. There is an increased alignment tolerance that, for example, can allow for less tool precision when positioning the discrete device 100 relative to a base that is to support the discrete device 100.

In some embodiments, a compressive strength of the terminal 120 in the engagement portion 121 is anisotropic. The compressive strength of the terminal 120 in the engagement portion 121 in a longitudinal direction may be larger than the compressive strength in a lateral direction. At least one effect can be that the large longitudinal compressive strength of the engagement portion 121 may prevent the terminal 120 from undesirable deformation, such as bending or buckling, in particular when being forced into the via 210.

A local lateral compressive strength of the terminal 120 in the engagement portion 121 may vary along a longitudinal direction. For example, in some embodiments, the engagement portion 121 of the terminal 120 may comprise a widened portion 125 that includes an opening herein referred to as an eye 126. The eye 126 may be elongated in a longitudinal direction of the engagement portion 121. The eye 126 may weaken the compressive strength of the terminal 120 in the engagement portion 121, whereby the engagement portion 121 may engage with the via 210 more easily. At least one effect can be that, at the same time, the terminal 120 at the widened portion 125 can provide resistance to the terminal 120 being sunk into a hole that is narrower than a width of the terminal 120 at the widened portion 125 and, because of the eye 126, the terminal 120, when squeezed into the hole, the widened portion 125 can yield more easily to a lateral force than to a vertical force.

By the sleeve portion 122, the terminal 120 conductively couples the engagement portion 121 to the electrical circuit element (not shown) which is contained in the element housing portion 111 of the housing 110. Thus, while the engagement portion 121 is completely outside the housing 110, in the sleeve portion 122, the terminal 120 is at least partially enclosed by the terminal housing portion 112 of the housing 110. At least one effect can be that, in addition to strength imparted by a rigidity of the terminal 120, the terminal housing portion 112 may provide additional robustness to the terminal 120. Thus, the at least partial enclosing of the sleeve portion 122 of the terminal 120 in the terminal housing portion 112 may provide mechanical reinforcement to the terminal 120 to effect an increased resistance against tilting, buckling or bending.

In some embodiments, a local lateral compressive strength of the terminal 120 in the engagement portion 121 may have a maximum at a transition to the sleeve portion 122. The local lateral compressive strength of the terminal 120 in the engagement portion 121 at a free end of the engagement portion 121 may be larger than in a center of the engagement portion 121. In some embodiments, the engagement portion 121 may be laterally wider than the sleeve portion 122. In some embodiments, more force can be applied when sinking the terminal into the hole which, in turn, means that a mechanical connection of the terminal to the base can be tighter and, thus, electrically more stable.

The terminal 120 may further comprise a flange portion 123. The flange portion 123 may provide a transition from the engagement portion 121 to the sleeve portion 122 of the terminal 120. In some embodiments, the flange portion 123 is configured to provide a stop to insertion of the terminal 120 into the via 210. For example, the flange portion 123 of the terminal 120 can be wider than the via 210. The flange portion 123, in particular, may be laterally wider than the engagement portion 121, at least, if the engagement portion 121 of the terminal 120 is forced into the via 210. In some embodiments, the flange portion 123 is laterally wider than the sleeve portion 122. In some embodiments, the flange portion 123 may have a lateral compressive strength which is essentially as large as the longitudinal compressive strength of the terminal 120. At least one effect can be that the laterally wide flange portion 123, when forced down onto the base 200 when the terminal 120 is inserted into the via 210, can stop the terminal 120 from being inserted too far and abutting the base 200, and can also provide more stability of the terminal 120 when inserted into the via 210 against tilt of the discrete device 100 on the base 200.

FIG. 5A and FIG. 5B show respective magnified views of the engagement portion 121 of the terminal 120 before and after engaging with the via 210 in the base 200.

First, as illustrated in FIG. 5A, the engagement portion 121 of the terminal 120 comprises the widened portion 125 having the eye 126. Further, the engagement portion 121 comprises the tip 129. The widened portion 125 of the engagement portion 121 comprises an outer wall 127 and, facing the eye 126, an inner wall 128. The outer wall 127 and the inner wall 128 may be substantially curved. Such an arrangement of the widened portion 125 may allow for weakening of the compression strength of the engagement portion 121 when the engagement portion 121 is inserted in the via 210.

In FIG. 5B, the engagement portion 121 has been inserted into the via 210 of the base 200. An inner wall of the base 200 may comprise a conductive liner 225 connected, for example, by the conductor line 220, to an electrical circuit supported by the base 200 (not shown). As a result of the insertion of the terminal 120 with the engagement portion 121 into the via 210, the outer wall 127 of the terminal 120 in the widened portion 125 deforms and secures the terminal 120 with the engagement portion 121 to the via 210 in the base 200 and forms a conductive contact with the conductive liner 225. This couples the circuit element (not shown) contained in the housing 110 of the discrete device to the electrical circuit (not shown) supported by the base 200 whereby, in effect, the circuit element of the discrete device becomes part of the electrical circuit supported by the base 200. The inner wall 128 of the widened portion 125 facing the eye 126 may also deform upon said insertion. As shown in FIG. 5B, as a result of the compression of the terminal 120 at the widened portion 125, the eye 126 may become narrow.

FIG. 6 shows a partial, magnified cross-sectional view of the discrete device, in accordance with some embodiments, for example, as discussed above with reference to FIGS. 1 to 5A and 5B, now engaged with the base 200. The base 200, as already discussed above, is configured to support an electrical circuit (not shown). In particular, the base 200 is provided with conductor lines 220, 220*a*, 220*b* and 220*c*. While each conductor line may connect to different portions of the electrical circuit, functionally, the conductor lines are the same in that each conductor line is configured to conduct electric current. Therefore, reference to each conductor line is made by a same reference numeral 220.

In the illustrated example, the base 200 has three vias arranged side by side. For the sake of readability, since the vias can structurally be similar or even the same, reference is made to each of the vias by the same reference numeral 210. In some embodiments, each via 210 is provided with a liner 225 on a wall of the via 210. The liner 225 can be conductive. The liner 225 can be connected to one or more of the conductor lines 220.

Referring to the discrete device engaged with the base 200 as illustrated in FIG. 6, in an embodiment, the engagement portion 121 of the terminal 120 is engaging with the via 210 in the base 200. As illustrated, a width of the eye 126 provided in the widened portion 125 of the engagement portion 121 of the terminal 120 can be reduced.

In assembly, as will now be described, the widened portion 125 of the engagement portion 121 can be laterally compressed. The terminal 120 with the engagement portion 121 is inserted into the via 210. The widened portion 125 having the eye 126, laterally, has less compressive strength then vertically. Therefore, when forced into the via 210, the widened portion 125 yields to the lateral constraining force of the via's wall. Thus, the widened portion 125 of the engagement portion may deform and compress. As a result of the insertion, the eye 126 in the widened portion 125 of the terminal 120 becomes narrow and a width of the widened portion 125 is reduced so as to fit into the via 210 and aid in firmly securing the discrete device within the via 210. The engagement portion 121, and more specifically the widened portion 125 pressed against the conductive liner 225 on the wall of the via 210, may form an electrically conductive contact with the conductive liner 225.

In some embodiments, the flange portion 123 abuts the base 200 outside the via 210. At least one effect can be that abutment of the flange portion 123 to the base 200 may provide more stability against tilt of the discrete device with respect to the base 200. Thus, the flange portion 123 can help in firmly securing the discrete device in the via 210.

Figure 7:
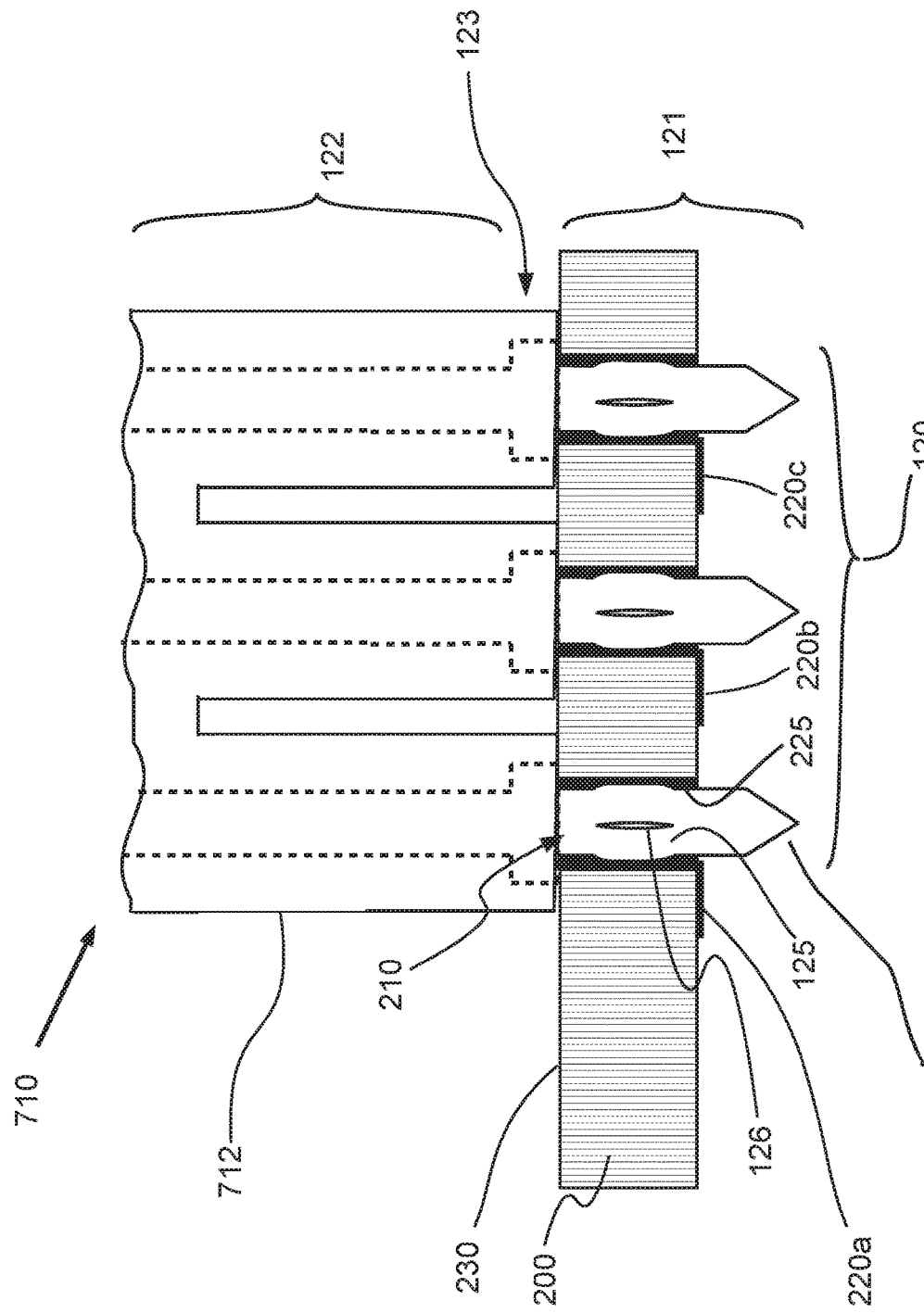
FIG. 7 shows a partial cross-sectional side view of a discrete device engaged with a base, in accordance with some embodiments.

FIG. 7 shows a partial, magnified view of a base 200 and a housing portion 710 of a discrete device engaged with one another, in accordance with some embodiments. As discussed above with reference to FIGS. 1 to 6, the discrete device contains the electrical circuit element encapsulated in a housing 710. Further, the discrete device has the plurality of terminals 120 connected to the electrical circuit element and provided as discussed above with reference to FIGS. 1 to 6. Likewise, the base 200 can be provided as discussed above, for example with reference to FIGS. 4 to 6.

As illustrated in FIG. 7, similar to the exemplary discrete device discussed above with reference to FIGS. 1 to 6, whose housing 110 comprises a terminal housing portion 112 that partially encapsulates the sleeve portion 122 of the terminals 120, the housing 710 of the exemplary discrete device illustrated in FIG. 7 comprises a terminal housing portion 712 for the sleeve portion 122 of the terminals 120. As illustrated in FIG. 7, the terminal housing portion 712 extends over the sleeve portion 122 of the terminals 120. In some embodiments, the flange portion 123 may also be enclosed inside the terminal housing portion 712. When the discrete device is inserted into the base 200, the housing 710 with a bottom face of the terminal housing portion 712, and the flange portion 123 of the terminal 120, abuts the base 200 as the engagement portion 121 engages with the via 210. At least one effect can be that the laterally wide face of the terminal housing portion 712, strengthened by the encapsulated flange portion 123, increases a contact surface for securely holding the terminal 120 in the terminal housing portion 712. Thus, the housing 710 of the discrete device may contribute to stability of the discrete device on the base 200 and, in particular, the housing 710 of the discrete device abutting the base 200 may provide a large resistance against tilt of the discrete device vis-a-vis the base 200. The width of the housing 110 abutting the base 200 provides a lever which may negate a lateral tilting force when applied to the discrete device. Additionally, the abutting of the housing 110 may keep the terminal 120 with the engagement portion 121 in place and firmly secured in the via 210 of the base 200. Meanwhile, the engagement portion 121, and more specifically the widened portion 125 having the eye 126, may form an electrically conductive contact with the conductive liner 225. Thus, the terminal 120, in contact with the liner 225 inside the via 210, can reliably and lastingly electrically connect to an associated conductor line 220*a*, 220*b* or 220*c* on the base 200.

Figure 8:
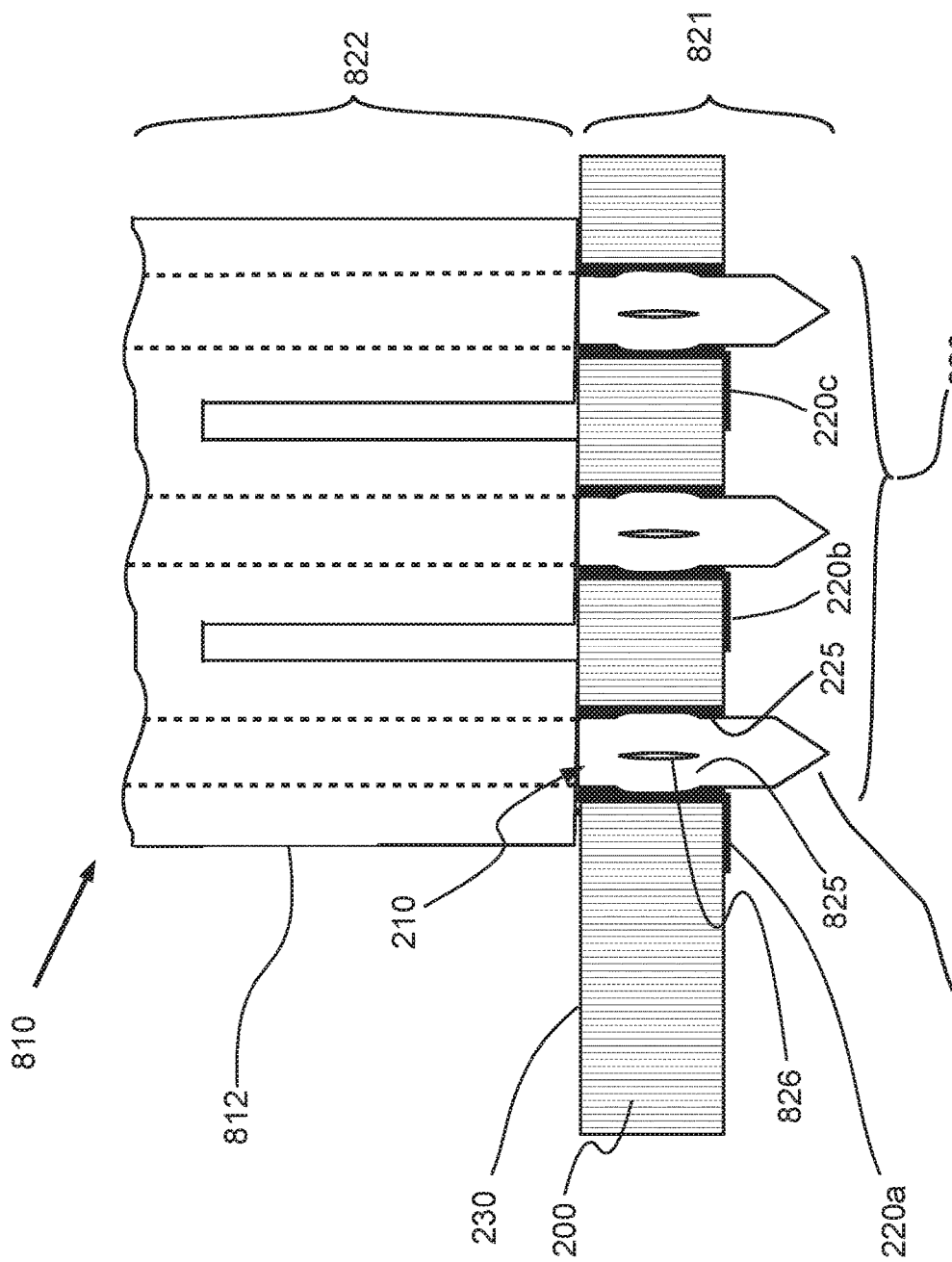
FIG. 8 shows a partial cross-sectional side view of a base and a discrete device engaged with one another, in accordance with some embodiments.

FIG. 8 shows a partial cross-sectional side view of the base 200 engaged with a discrete device in accordance with some embodiments. In yet another embodiment according the invention, as in the example described above with reference to FIG. 7, the discrete device comprises a housing 810 having an element housing portion (not shown in FIG. 8) for an electrical element and a terminal housing portion 812 for terminals 820 to couple the electrical element to a circuit supported by the base 200.

A plurality of terminals 820 each comprise an engagement portion 821 and a sleeve portion 822. The engagement portion 821 of the terminal 820 can be provided as described above with reference to examples illustrated in FIGS. 1 to 7. In particular, in the example illustrated in FIG. 8, as in the example described above with reference to FIG. 7, the engagement portion 821 of the terminal 820 extends from the terminal housing portion 812 of the housing 810 while the sleeve portion 822 of the terminal 820 is essentially completely enclosed within the terminal housing portion 812.

The sleeve portion 822 of the terminal 820, in contrast to other embodiments described above, can be provided without any flange. Thus, no flange portion is present between the engagement portion 821 and the sleeve portion 822. The housing 810 abuts the base 200 as the engagement portion 821 engages with the via 210. As discussed above with reference to the embodiment illustrated in FIG. 7, due to the width of the housing 810 abutting the base 200, a bottom face of the terminal housing portion 812 can act as a lever which may resist a lateral tilting force when applied to the discrete device. Thus, the abutting of the housing 810 may provide a large resistance against tilt of the discrete device abutting the base 200. Additionally, the abutting of the housing 810 may allow the engagement portion 821 of the terminal 820 to stay in place and firmly be secured in the via 210 of the base 200. Meanwhile, the engagement portion 821 of the terminal 820, and more specifically the widened portion 825 having the eye 826, may form an electrically conductive contact with the conductive liner 225 of the via 210 to provide a reliable electrical connection to the conductor line 220 on the base 200.

As used herein, the wording "conductor line" can mean a conductor trace, sometimes also referred to as a conductor track, i.e., a path formed of some substance capable and/or configured to conduct electric signals. The substance, for example, can comprise a metal such as aluminum, copper, gold, etc. The substance can comprise another conductive material such as polysilicon.

As used herein, the wording "proximal" and "distal" must not be understood as limiting. For example, a proximal portion of a terminal about to be inserted into a via in a base can be closer to the base than a distal portion of the terminal.

As used herein, directional terminology, such as 'top', 'bottom', 'front', 'back', 'leading', 'trailing', etc., is used with reference to the orientation of the figure(s) being described.

As used herein, the wording "vertical" and "lateral" must not be understood as limiting. Generally, "lateral" has a meaning relative to "vertical", since "lateral" means "essentially perpendicular to vertical". However, neither "vertical" nor "lateral" are necessarily to be understood relative to a field of gravitation, since a weight of the discrete device and associated weight forces will typically be negligible in comparison with forces associated with forcing the terminal into the via.

As used herein, terms such as 'first', 'second', and the like, are also used to describe various elements, regions, sections, etc. and are also not intended to be limiting.

As used herein, the terms 'coupled' and 'connected' may have been used to describe how various elements interface. Unless expressly stated or at least implied otherwise, such described interfacing of various elements may be either direct or indirect.

As used herein, the word 'terminal' denotes a conductor line or other circuit element or circuitry configured to link coupled components.

As used herein, the terms 'having', 'containing', 'including', 'with' or variants thereof, and like terms are open ended terms intended to be inclusive. These terms indicate the presence of stated elements or features, but do not preclude additional elements or features.

As used herein, the articles 'a' and 'an' should generally be construed to mean 'one or more,' unless specified otherwise or clear from context to be directed to a singular form.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion.

In the above description of exemplary implementations, for purposes of explanation, specific numbers, materials configurations, and other details are set forth in order to better explain the invention, as claimed. However, it will be apparent to one skilled in the art that the claimed invention may be practised using different details than the exemplary ones described herein. For example, in some embodiments, the terminals of the discrete device may have the widened portion shaped differently from the widened portion described above or have no widened portion at all.

The inventors intend the described exemplary embodiments/implementations to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies. Although the disclosure has been shown and described with respect to one or more implementations, equivalent alterations and modifications will occur to others skilled in the art based upon a reading and understanding of this specification and the annexed drawings.

The invention claimed is:

1. An apparatus, comprising:
    a base supporting an electrical circuit, wherein the base includes a via; and
    a discrete device having a housing and a terminal that extends from the housing, wherein the terminal includes a widened portion having a lateral compressive strength, and wherein the widened portion deforms and secures the terminal within the via when the terminal is inserted into the via and the housing abuts the base.

2. The apparatus of claim 1, wherein the via comprises a conductive liner that is connected to the electrical circuit.

3. The apparatus of claim 1, wherein the widened portion of the terminal includes an eye, and wherein the eye is elongated in a longitudinal direction of the terminal.

4. A device for use in an electrical circuit, comprising:
    a circuit element;
    a housing for the circuit element; and
    a terminal for coupling the circuit element to the electrical circuit, wherein the terminal includes an engagement portion configured to engage a base for the electrical circuit and a sleeve portion that couples the engagement portion to the circuit element, wherein the housing encloses the sleeve portion.

5. The device of claim 4, wherein a compressive strength of the engagement portion is anisotropic.

6. The device of claim 4, wherein the engagement portion has an elongated body, and wherein a longitudinal compressive strength of the engagement portion is larger than a lateral compressive strength.

7. The device of claim 4, wherein a local lateral compressive strength of the engagement portion varies along a longitudinal direction, and wherein the local lateral compressive strength of the engagement portion has a maximum at a transition to the sleeve portion.

8. The device of claim 7, wherein the local lateral compressive strength of the engagement portion at a free end of the engagement portion is larger than in a center of the engagement portion.

9. The device of claim 4, wherein the engagement portion is laterally wider than the sleeve portion, and wherein the engagement portion includes an eye.

10. The device of claim 4, wherein a tip of the engagement portion is tapered.

11. The device of claim 4, wherein the terminal comprises a flange portion that is laterally wider than the sleeve portion, and wherein the flange portion is laterally wider than the engagement portion.

12. The device of claim 11, wherein the flange portion has a lateral compressive strength that is approximately equal to the longitudinal compressive strength of the terminal.

13. The device of claim 11, wherein the flange portion provides a transition from the engagement portion to the sleeve portion of the terminal, and wherein the housing encloses the flange portion of the terminal.

14. The device of claim 4, wherein the device comprises at least three terminals, and wherein the engagement portions of the at least three terminals are each arranged in a same plane.

15. The device of claim 14, wherein the engagement portions of the at least three terminals have a same size and shape.

16. The device of claim 4, wherein the circuit element is a transistor.

17. A device for use in an electrical circuit, comprising:
    a circuit element;
    a housing for the circuit element that includes an element housing portion and a terminal housing portion; and at least one terminal for coupling the circuit element to the electrical circuit, wherein the circuit element is enclosed by the element housing portion and the at least one terminal is at least partially enclosed by the terminal housing portion, wherein the electrical circuit is conductively coupled to at least one via, wherein the at least one terminal includes a widened portion having a lateral compressive strength, and wherein the widened portion deforms and secures the at least one terminal within the at least one via when the at least one terminal is inserted into the at least one via.

18. A device for use in an electrical circuit, comprising:
a circuit element;
a housing for the circuit element that includes an element housing portion and a terminal housing portion; and
at least one terminal for coupling the circuit element to the electrical circuit, wherein the circuit element is enclosed by the element housing portion and the at least one terminal is at least partially enclosed by the terminal housing portion, wherein the at least one terminal includes an engagement portion configured to engage a base for the electrical circuit and a sleeve portion that couples the engagement portion to the circuit element, wherein the at least one terminal includes a flange portion that is laterally wider than the sleeve portion, and wherein the flange portion is laterally wider than the engagement portion.

19. The device of claim 18, wherein the circuit element is a transistor.

20. A device for use in an electrical circuit, comprising:
a circuit element
a housing for the circuit element that includes an element housing portion and a terminal housing portion; and
at least three terminals for coupling the circuit element to the electrical circuit, wherein the circuit element is enclosed by the element housing portion and the at least three terminals are at least partially enclosed by the terminal housing portion, wherein the at least three terminals include an engagement portion configured to engage a base for the electrical circuit and a sleeve portion that couples the engagement portion to the circuit element, wherein the at least three terminals include a flange portion that is laterally wider than the sleeve portion, wherein the flange portion is laterally wider than the engagement portion, and wherein the engagement portion of the at least three terminals are each arranged in a same plane.

* * * * *